United States Patent
Yoshikawa et al.

(10) Patent No.: US 7,351,505 B2
(45) Date of Patent: Apr. 1, 2008

(54) PHASE SHIFT MASK BLANK, PHASE SHIFT MASK, AND PATTERN TRANSFER METHOD

(75) Inventors: Hiroki Yoshikawa, Niigata-ken (JP); Yukio Inazuki, Niigata-ken (JP); Satoshi Okazaki, Niigata-ken (JP); Takashi Haraguchi, Tokyo (JP); Yuichi Fukushima, Tokyo (JP); Yoshihiro Ii, Tokyo (JP); Tadashi Saga, Tokyo (JP)

(73) Assignees: Shin-Etsu Chemical Co., Ltd, Tokyo (JP); Toppan Printing Co., Ltd, Tokyo (JP)

( * ) Notice: Subject to any disclaimer, the term of this patent is extended or adjusted under 35 U.S.C. 154(b) by 693 days.

(21) Appl. No.: 10/968,886

(22) Filed: Oct. 21, 2004

(65) Prior Publication Data

US 2005/0112477 A1 May 26, 2005

(30) Foreign Application Priority Data

Oct. 24, 2003 (JP) ............................. 2003-364227

(51) Int. Cl.
*G03F 1/00* (2006.01)
(52) U.S. Cl. ........................................................ 430/5
(58) Field of Classification Search .................... 430/5, 430/322–324; 428/428, 430
See application file for complete search history.

(56) References Cited

U.S. PATENT DOCUMENTS

| 7,011,910 B2 * | 3/2006 | Shiota et al. ................. 430/5 |
| 2003/0008219 A1 | 1/2003 | Kaneko et al. |
| 2003/0077520 A1 | 4/2003 | Smith |
| 2003/0180630 A1 | 9/2003 | Shiota et al. |

FOREIGN PATENT DOCUMENTS

| EP | 0872767 A2 | 10/1998 |
| JP | 7-140635 A | 6/1995 |

OTHER PUBLICATIONS

Fukuhara et al., 19th Annual Symposium on Photomask Technology, vol. 3873, pp. 979-986, (1999).

* cited by examiner

*Primary Examiner*—S. Rosasco
(74) *Attorney, Agent, or Firm*—Birch, Stewart, Kolasch & Birch, LLP

(57) ABSTRACT

In a phase shift mask blank comprising a phase shift multilayer film on a substrate, the phase shift multilayer film consists of at least one layer of light absorption function film and at least one layer of phase shift function film, and the light absorption function film has an extinction coefficient k which increases as the wavelength changes from 157 nm to 260 nm, and has a thickness of up to 15 nm. The phase shift mask blank has minimized wavelength dependency of transmittance and can be processed with a single dry etching gas.

9 Claims, 8 Drawing Sheets

FIG.16A  FIG.16B
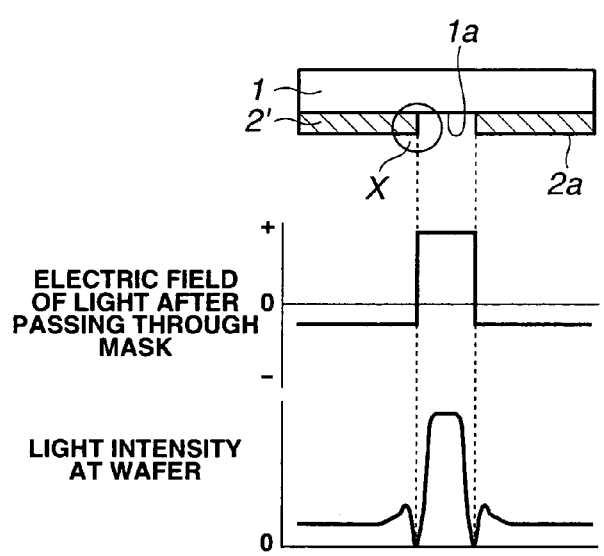
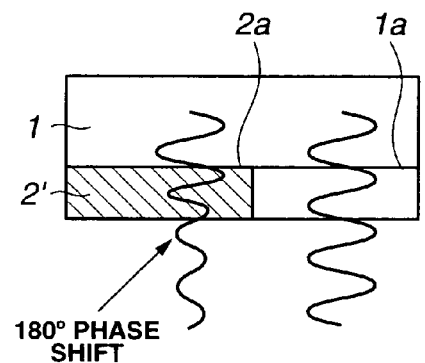

PHASE SHIFT MASK BLANK, PHASE SHIFT MASK, AND PATTERN TRANSFER METHOD

CROSS-REFERENCE TO RELATED APPLICATION

This non-provisional application claims priority under 35 U.S.C. §119(a) on Patent Application No. 2003-364227 filed in Japan on Oct. 24, 2003, the entire contents of which are hereby incorporated by reference.

TECHNICAL FIELD

This invention relates to a phase shift mask blank and phase shift mask for use in the fabrication of semiconductor integrated circuits, and more particularly, to a phase shift mask of the halftone type wherein light of exposure wavelength is attenuated by the phase shift film, a phase shift mask blank from which the mask is obtained, and a pattern transfer method.

BACKGROUND ART

Photomasks are used in a wide variety of applications including the fabrication of semiconductor integrated circuits such as ICs, LSIs and VLSIs. Basically, the photomask is prepared from a photomask blank having a chromium based light-shielding film on a transparent substrate, by forming a predetermined pattern in the light-shielding film by photolithography using UV or electron beams. The current demand for a higher level of integration in the semiconductor integrated circuit market has created a need for a smaller pattern rule. The traditional solution is by reducing the wavelength of exposure light.

However, reducing the wavelength of exposure light improves resolution at the sacrifice of focal depth. This lowers the process stability and adversely affects the manufacture yield of products. One effective pattern transfer method for solving the problem is a phase shift method. A phase shift mask is used as a mask for transferring a micro-pattern.

Referring to FIGS. 16A and 16B, a phase shift mask, specifically a halftone phase shift mask is illustrated as comprising a substrate 1 and a phase shifter film 2' deposited thereon. The mask consists of a phase shifter 2a that forms a pattern on the substrate and an uncovered area 1a of the substrate 1 that is exposed where the phase shifter 2a is absent. A phase difference of about 180° is set between light transmitted by the uncovered substrate area 1a and light transmitted by the phase shifter 2a. Due to light interference at the pattern boundary, the light intensity at the interfering boundary becomes zero, improving the contrast of a transferred image. The phase shift method permits to increase the focal depth for acquiring the desired resolution. This achieves improvements in resolution and exposure process margin, as compared with conventional masks having ordinary light-shielding patterns in the form of chromium film.

Depending on the light transmission of phase shifter, the phase shift masks are generally divided for practical application into full transmission type phase shift masks and halftone type phase shift masks. The full transmission type phase shift masks are transparent to the exposure light wavelength because the light transmittance of the phase shifter section is equal to the light transmittance of uncovered substrate areas. In the halftone type phase shift masks, the light transmittance of the phase shifter section is several percents to several tens of percents of the light transmittance of uncovered substrate areas.

FIGS. 17 and 18 illustrate the basic structure of a halftone type phase shift mask blank and a halftone type phase shift mask, respectively. The halftone type phase shift mask blank shown in FIG. 17 has a halftone phase shift film 2' formed over substantially the entire surface of a substrate 1. Patterning the phase shift film 2' results in the halftone type phase shift mask which is shown in FIG. 18 as comprising phase shifter sections 2a forming the pattern on the substrate 1 and uncovered areas 1a of the substrate where the phase shifter is absent. Light that passes the phase shifter section 2a is phase shifted relative to light that passes the uncovered substrate area 1a. The transmittance of the phase shifter section 2a is set to a light intensity that is insensitive to the resist on a wafer or article subject to pattern transfer. Accordingly, the phase shifter section 2a has a light-shielding function of substantially shielding exposure light.

The halftone type phase shift masks include single-layer halftone type phase shift masks featuring a simple structure and ease of manufacture. Some single-layer halftone type phase shift masks known in the art have a phase shifter of MoSi base materials such as MoSiO and MoSiON as described in JP-A 7-140635.

Although the halftone type phase shift mask is an effective means for accomplishing a high resolution in a simple manner, it suffers from the following problem due to the difference between the wavelength at which light exposure through the mask is carried out (exposure wavelength) and the wavelength of light used for defect inspection of the mask itself (inspection wavelength).

Commonly used in the halftone type phase shift masks is a metal and silicon oxynitride film which has the propensity of increasing its transmittance as the wavelength of irradiating light becomes longer. In comparison between the exposure wavelength and the inspection wavelength, the inspection wavelength is longer as the general rule. In the case of a mask adapted for use with an ArF excimer laser with an exposure wavelength of 193 nm, the defect inspection system generally uses a wavelength of around 260 nm, especially about 266 nm, which is longer than the exposure wavelength of 193 nm. The defect inspection system fails in inspection unless there is a contrast between the uncovered substrate area and the phase shifter. If the transmittance of the phase shifter at the inspection wavelength exceeds 50%, its difference from the transmittance of the uncovered substrate area becomes too small to provide a sufficient contrast for inspection, interfering with defect inspection with a satisfactory precision. The above-mentioned problem arising from the difference between the inspection wavelength and the exposure wavelength is pertinent not only to transmittance, but also to reflectance.

As discussed above, the halftone type phase shift mask is desired to have a minimized dependency of transmittance and reflectance on wavelength. To solve the problem, a study has been made on a phase shift film of multilayer structure in which a transparent film (typically oxide film) having a phase shift function is combined with a metal film having a light absorption function. However, the prior art phase shift film of multilayer structure has a substantial difference in dry etching behavior between the transparent film having a phase shift function and the metal film having a light absorption function. This necessitates a combination of etching processes using different etching gases in the mask manufacture, adding to the cost of mask manufacture (resulting from the increased expense of facility, an increased number of steps, and a reduced production yield).

Also, the halftone phase shift film of multilayer structure has the problem that it is impossible to reduce the dependency of transmittance and reflectance on wavelength at the same time. In the structure in which a transparent film having a phase shift function is combined with a metal film having a light absorption function, a defect repairing system having a laser built therein operates so that the energy of laser light concentrates only in the film having a light absorption function, failing to provide satisfactory repair.

SUMMARY OF THE INVENTION

Therefore, an object of the present invention is to provide a phase shift mask blank which has minimized dependency of transmittance on wavelength and can be processed with a single dry etching gas; a phase shift mask using the same; and a pattern transfer method.

Regarding a phase shift mask blank comprising a phase shift multilayer film on a substrate, the inventor has discovered that when the phase shift multilayer film consists of at least one layer of light absorption function film formed of a metal or a metal and silicon, or an unsaturated metal compound in the form of an oxide, nitride, carbide, oxynitride, oxynitride carbide or nitride carbide comprising a metal or a metal and silicon as primary elements, and at least one layer of phase shift function film formed of an oxide, nitride, carbide, oxynitride, oxynitride carbide or nitride carbide comprising a metal or a metal and silicon, the light absorption function film has an extinction coefficient k relative to light of wavelength 157 to 260 nm which increases as the wavelength moves from 157 nm toward 260 nm, and the light absorption function film has a thickness of up to 15 nm, then this phase shift mask blank has minimized dependency of transmittance on wavelength and can be processed with a single dry etching gas.

When one layer of light absorption function film is present and disposed contiguous to the substrate, or when two layers of light absorption function film are present, and one of the two layers is disposed contiguous to the substrate, defects, if any, can be effectively repaired by means of a laser. When two layers of light absorption function film are present, the dependency of reflectance on wavelength can also be minimized. Then inspection becomes possible with a defect inspecting system of photo-detection type commonly employed in the mask manufacture process.

In one aspect, the present invention provides a phase shirt mask blank comprising a phase shift multilayer film on a Substrate. The phase shift multilayer film consists of at least one layer of light absorption function film formed of a metal, a metal and silicon, or an unsaturated metal compound in the form of an oxide, nitride, carbide, oxynitride, oxynitride carbide or nitride carbide comprising a metal or a metal and silicon as primary elements, and at least one layer of phase shift function film formed of an oxide, nitride, carbide, oxynitride, oxynitride carbide or nitride carbide comprising a metal or a metal and silicon. The light absorption function film has a thickness of up to 15 nm. The light absorption function film has an extinction coefficient k relative to light of wavelength 157 to 260 nm which increases from the wavelength 157 nm toward 260 nm. Preferably, the extinction coefficient k of the light absorption function film is at least 0.5 in the wavelength range of 157 to 260 nm.

In a preferred embodiment, one layer of light absorption function film is present and disposed contiguous to the substrate.

In another preferred embodiment, two layers of light absorption function film are present, and one of the two layers is disposed contiguous to the substrate. More preferably, the interface of the other layer of light absorption function film on the surface side of the phase shift multilayer film is located at a depth within 68.75 nm from the surface of the phase shift multilayer film.

The phase shift mask blank may further include a chromium based light-shielding film and/or a chromium based antireflective film on the phase shift multilayer film.

In another aspect, the invention provides a phase shift mask obtained by patterning the phase shift multilayer film in the phase shift mask blank defined above.

In a further aspect, the invention provides a method of transferring a pattern formed on a phase shift mask to an article. An acceptable phase shift mask is used which is selected by inspecting for defects phase shift masks using light having a wavelength of 240 to 270 nm. Alternatively, a phase shift mask as described above is used and the alignment of the mask is adjusted using light having a wavelength of 450 to 600 nm.

The phase shift multilayer film of the inventive phase shift mask blank has minimized dependency of transmittance on wavelength, can be processed with a single dry etching gas, and exhibits a favorable transmittance at both the exposure wavelength and the inspection wavelength. Thus the phase shift mask blank and the phase shift mask obtained therefrom according to the invention are amenable to the use of a shorter wavelength as the exposure wavelength.

When one layer of light absorption function film is disposed contiguous to the substrate, or when one of two layers of light absorption function film is disposed contiguous to the substrate, defects, if any, can be effectively repaired by means of a laser. The provision of two layers of light absorption function film also minimizes the dependency of reflectance on wavelength. Then inspection becomes possible with a defect inspecting system of photo-detection type commonly employed in the mask manufacture process.

BRIEF DESCRIPTION OF THE DRAWINGS

FIG. 10 illustrates in sectional view the method of manufacturing phase shift masks according to the invention.

FIGS. 16A and 16B illustrate the operating principle of a halftone phase shift mask. FIG. 16B is an enlarged view of region X in FIG. 16A.

DESCRIPTION OF THE PREFERRED EMBODIMENT

Figure 1:
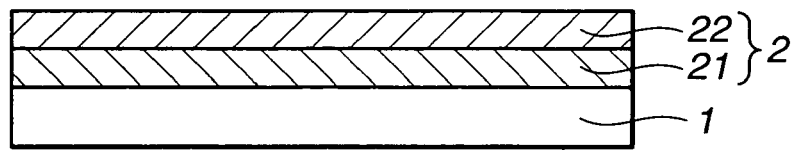
FIG. 1 illustrates a first embodiment of the phase shift mask blank of the invention.

The invention is directed to a phase shift mask blank comprising a phase shift multilayer film on a substrate. The phase shift multilayer film consists of at least one layer of light absorption function film formed of a metal, a metal and silicon, or an unsaturated metal compound in the form of an oxide, nitride, carbide, oxynitride, oxynitride carbide or nitride carbide comprising a metal or a metal and silicon as primary elements, and at least one layer of phase shift function film formed of an oxide, nitride, carbide, oxynitride, oxynitride carbide or nitride carbide comprising a metal or a metal and silicon. The light absorption function film has an extinction coefficient k relative to light of wavelength 157 to 260 nm which increases as the wavelength moves from 157 nm to 260 nm. The light absorption function film has a thickness of up to 15 nm.

In the phase shift mask blank of the invention, a phase shift multilayer film is formed on a substrate which is made of quartz, $CaF_2$ or a material that is transparent to the exposure light.

In general, metal compounds and metal silicides used as the phase shift film on phase shift mask blanks have a transmittance that is dependent on the wavelength of light. For a molybdenum and silicon-containing oxynitride film commonly used as the halftone phase shift film, for example, its transmittance sharply increases as the wavelength becomes longer, in the wavelength range of less than about 300 nm. Differently stated, the extinction coefficient k decreases as the wavelength becomes longer.

In the event transmittance has such a propensity, when a phase shift mask having a phase shift film whose transmittance is set for a $F_2$ laser (157 nm) is inspected for defects using a defect inspecting system having an inspection wavelength in excess of 157 nm, there results a situation that satisfactory inspection is impossible. This is because a sufficient contrast relative to the uncovered substrate area is not obtainable due to the high transmittance at the inspection wavelength.

To solve this problem, the invention incorporates in the phase shift multilayer film a light absorption function film having an extinction coefficient k which increases as the wavelength becomes longer in the range of 157 nm to 260 nm.

Specifically, according to the invention, the phase shift multilayer film is constructed by combining at least one layer of a film serving the main function of absorbing light (light absorption function film) with at least one layer of a film serving the main function of phase shift and absorbing a little of light (phase shift function film); the light absorption function film is formed of a metal, or a metal and silicon, or an unsaturated metal compound in the form of an oxide, nitride, carbide, oxynitride, oxynitride carbide or nitride carbide comprising a metal or a metal and silicon as primary elements, having an extinction coefficient k relative to light of wavelength 157 to 260 nm which increases from the wavelength 157 nm toward 260 nm; and the phase shift function film is formed of an oxide, nitride, carbide, oxynitride, oxynitride carbide or nitride carbide comprising a metal or a metal and silicon. Then the transmittance does not sharply increase even when the inspection wavelength is in excess of 157 nm, for example, in the range of 240 to 270 nm. This allows for effective defect inspection to be implemented with precision using as the inspection wavelength a wavelength which is longer than the exposure wavelength.

As mentioned above, the phase shift multilayer film of the invention meets the contradictory requirements of maintaining the required transmittance property relative to the exposure wavelength and exhibiting the required transmittance property relative to the inspection wavelength which is longer than the exposure wavelength.

Preferably the light absorption function film has an extinction coefficient k of at least 0.5, more preferably at least 1 in the wavelength range of 157 to 260 nm.

Figure 2:
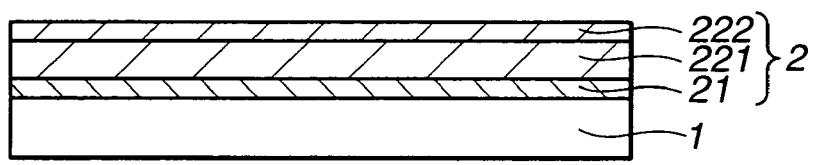
FIG. 2 illustrates a second embodiment of the phase shift mask blank of the invention including one layer of light absorption function film disposed contiguous to a substrate.
Figure 3:
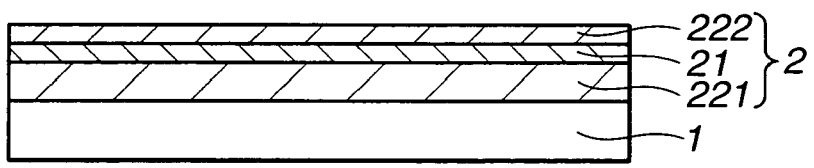
FIG. 3 illustrates a third embodiment of the phase shift mask blank of the invention including one layer of light absorption function film disposed apart from a substrate.
Figure 4:
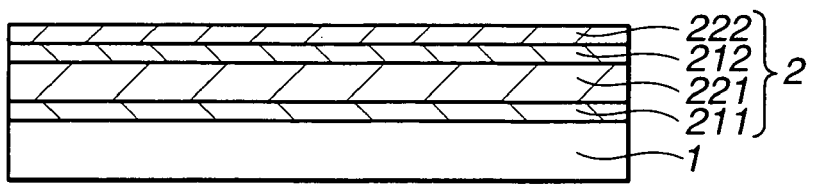
FIG. 4 illustrates a fourth embodiment of the phase shift mask blank of the invention including two layers of light absorption function film, with one layer disposed contiguous to a substrate.

Referring to the figures, there are illustrated several embodiments of the phase shift mask blank having such a phase shift multilayer film. FIG. 1 illustrates a first embodiment of the phase shift mask blank in which one layer of light absorption function film 21 and one layer of phase shift function film 22 are formed on a substrate 1. FIG. 2 illustrates a second embodiment of three-layer structure in which a light absorption function film 21 is formed on a substrate, and a first layer of phase shift function film 221 and a second layer of phase shift function film 222 are sequentially formed thereon. FIG. 3 illustrates a third embodiment of three-layer structure in which a first layer of phase shift function film 221 is formed on a substrate 1, a light absorption function film 21 is formed thereon, and a second layer of phase shift function film 222 is formed thereon. FIG. 4 illustrates a fourth embodiment of four-layer structure in which a first layer of light absorption function film 211 is formed on a substrate 1, and a first layer of phase shift function film 221, a second layer of light absorption function film 212, and a second layer of phase shift function film 222 are sequentially formed thereon. Preferred are those structures in which two layers of light absorption function film and two layers of phase shift function film are alternately deposited.

Figure 5:
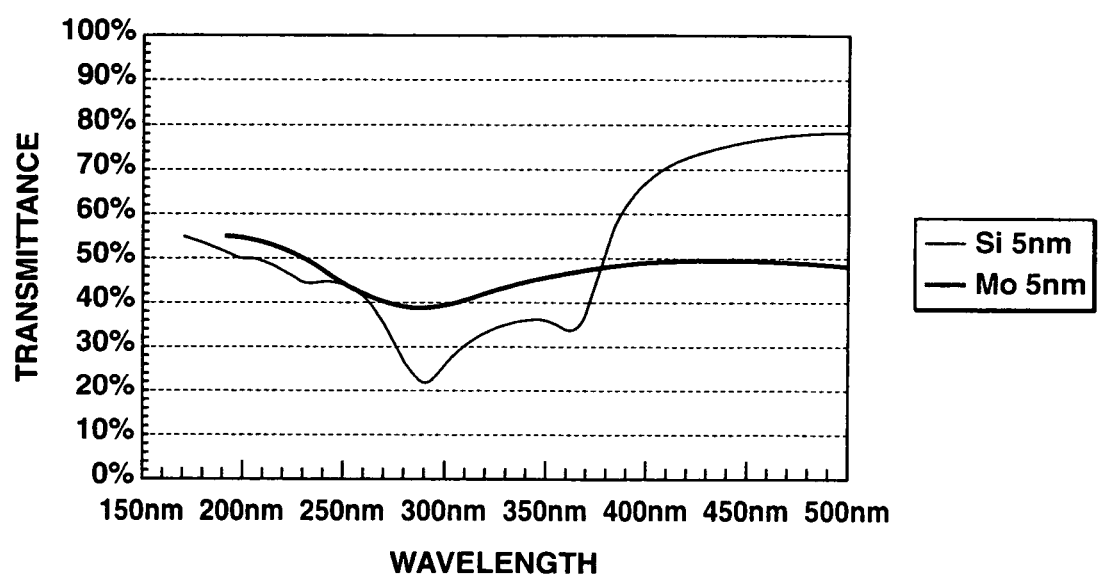
FIG. 5 is a graph showing the transmittance versus wavelength of Mo and Si.

In the invention, the light absorption function film is formed of a metal, or a metal and silicon, or an unsaturated metal compound in the form of an oxide, nitride, carbide, oxynitride, oxynitride carbide or nitride carbide comprising a metal or a metal and silicon as primary elements. As seen from the graph of FIG. 5, the transmittance of a film of molybdenum (Mo) or silicon (Si) alone decreases as the wavelength becomes longer in a wavelength range proximate to or below 280 nm. That is, the extinction coefficient k increases as the wavelength becomes longer. In this regard, a material composed of a metal or a metal and silicon is effective in reducing the dependency on wavelength of transmittance of a phase shift multilayer film, and a metal compound having low contents of light elements relative to a metal or a metal and silicon, i.e., an unsaturated metal compound of composition in which the contents of oxygen, nitrogen and carbon are lower than the stoichiometry is effective in reducing the dependency on wavelength of transmittance of a phase shift multilayer film.

Of the metal, the metal and silicon, or the unsaturated metal compound of which the light absorption function film is formed, the metal may be any element selected from among transition metals, lanthanoids and combinations thereof. Of these, Mo, Zr, Ta, Cr and Hf are preferred, with Mo and Zr being most preferred.

As used herein, the "stoichiometry" refers to a compound in which constituent elements assume typical valence numbers so as to provide an exact balance of electric charges. The metal compound having elements in such a constitution ratio is referred to as "saturated metal compound." Of exemplary metals, Mo is hexa-valent (6+), Zr is tetra-valent (4+), Ta is penta-valent (5+), Cr is tri-valent (3+), Hf is tetra-valent (4+), and silicon (Si) is tetra-valent (4+). Of light elements, oxygen (O) is di-valent (2−), nitrogen (N) is tri-valent (3−), and carbon is tetra-valent (4−). Specifically, in the case of an oxide containing molybdenum and silicon in a ratio of 1:2, the stoichiometric composition is $MoSi_2O_7$; and in the case of a nitride containing molybdenum and silicon in a ratio of 1:1, the stoichiometric composition is $MoSiN_{10/3}$.

By contrast, a metal compound in which the contents of light elements, i.e., oxygen, nitrogen and carbon are lower than the stoichiometry so that the apparent electric charge balance determined by the valence numbers is thrown off is referred to as "unsaturated metal compound." Specifically, in the case of oxides containing molybdenum and silicon in a ratio of 1:2, those compounds having the average composition:

$MoSi_2O_{7-a}$ wherein a is a positive number of $0<a<7$ are unsaturated metal compounds; and in the case of nitrides containing molybdenum and silicon in a ratio of 1:1, those compounds having the average composition: $MoSiN_{(10/3)b}$ wherein b is a positive number of $0<b<10/3$ are unsaturated metal compounds.

Although the reduced content of light element tips the apparent electric charge balance as mentioned above, a balance of electric charges is actually kept by virtue of generation of positive electric charges like holes and a change of metal valence number (e.g., the valence number of Mo changes from hexa-valence (6+) to tri-valence (3+)).

Preferred examples of the unsaturated metal compound of which the light absorption function film is formed include unsaturated metal silicide oxides, unsaturated metal silicide oxynitrides, and unsaturated metal silicide oxynitride carbides. As to their composition, preferably the unsaturated metal silicide oxides consist essentially of 0.2 to 80 at % of M (metal), 19 to 90 at % of Si and 0.1 to 60 at % of O; the unsaturated metal silicide oxynitrides consist essentially of 0.2 to 80 at % of M (metal), 19 to 90 at % of Si, 0.1 to 50 at % of O and 0.1 to 50 at % of N; and the unsaturated metal silicide oxynitride carbides consist essentially of 0.2 to 80 at % of M (metal), 19 to 90 at % of Si, 0.1 to 45 at % of O, 0.1 to 45 at % of N and 0.1 to 30 at % of C.

The light absorption function film can be formed by using a metal target, silicon target or metal silicide target properly selected in accordance with the desired composition of the light absorption function film and sputtering in an inert gas atmosphere such as neon, argon or krypton. When the light absorption function film is formed of an unsaturated metal compound, it may be similarly formed by suitably feeding one or more of an oxygen-containing gas, a nitrogen-containing gas and a carbon-containing gas to the sputtering gas and effecting reactive sputtering. The use of the reactive sputtering technique allows for proper adjustment of a compositional ratio of oxygen, nitrogen and carbon, enabling to adjust optical properties. This leads to an increased freedom of design.

In the invention, the phase shift function film is formed of an oxide, nitride, carbide, oxynitride, oxynitride carbide or nitride carbide comprising a metal or a metal and silicon. Preferred are saturated metal compounds of the composition having stoichiometric contents of oxygen, nitrogen and carbon. A phase shift function film formed of a saturated metal compound has the additional advantage of chemical resistance.

The metal of which the phase shift function film is constructed may be any element selected from among transition metals, lanthanoids and combinations thereof. Of these, Mo, Zr, Ta, Cr and Hf are preferred, with Mo and Zr being most preferred.

The phase shift function film is preferably formed of metal silicide oxides, metal silicide oxynitrides, or metal silicide oxynitride carbides. As to their composition, preferably the metal silicide oxides consist essentially of 0.2 to 25 at % of M (metal), 10 to 42 at % of Si and 30 to 60 at % of O; the metal silicide oxynitrides consist essentially of 0.2 to 25 at % of M (metal), 10 to 57 at % of Si, 2 to 20 at % of O and 5 to 57 at % of N; and the metal silicide oxynitride carbides consist essentially of 0.2 to 25 at % of M (metal), 10 to 57 at % of Si, 2 to 20 at % of O, 5 to 57 at % of N and 0.5 to 30 at % of C.

The phase shift function film can be formed by using a metal target, silicon target or metal silicide target properly selected in accordance with the desired composition of the phase shift function film, feeding an inert gas such as neon, argon or krypton and one or more of an oxygen-containing gas, a nitrogen-containing gas and a carbon-containing gas, and effecting reactive sputtering.

According to the invention, the light absorption function film and the phase shift function film are constructed as mentioned above, and the light absorption function film (each layer when more than one layer of light absorption function film is provided) have a thickness of up to 15 nm, preferably up to 10 nm, more preferably up to 6 nm, even more preferably up to 2.5 nm, and most preferably up to 1.25 nm. Although the phase shift multilayer film is a multilayer film having stacked layers of light absorption function film and phase shift function film, the controlled thickness of the light absorption function film ensures that the two types of films can be processed with a single dry etching gas, especially fluoride gas because they can be etched at rates whose difference is not substantially problematic.

In prior art phase shift film, a metal film is sometimes used as a stop layer in the step of etching with a fluoride gas. In this case, the etching of the metal film must use a chloride gas. In contrast, the phase shift multilayer film of the invention eliminates a need to change the gas species used in dry etching of the light absorption function film and the phase shift function film. With a single dry etching gas suited for the etching of the phase shift function film, the etching of the light absorption function film is also possible. Thus a mask can be manufactured by a dry etching process of simple procedure.

For some types of phase shift masks, defects in the phase shift film may be repaired using a laser beam. In some cases of the invention, the light absorption function film of the phase shift multilayer film is likely to absorb the laser energy and the phase shift function film is unlikely to absorb the laser energy. This can raise a problem that upon irradiation of the phase shift multilayer film with laser light, film removal is not done partially, resulting in a lowering of repair reliability.

In a preferred embodiment of the invention, one layer of light absorption function film is present and disposed contiguous to the substrate, or two layers of light absorption function film are present, and one of the two layers is disposed contiguous to the substrate. With this construction, even when laser absorption characteristics differ between the light absorption function film and the phase shift function film as pointed out above, the phase shift multilayer film can be stripped off at the same time as the light absorption function film which is likely to absorb energy is removed from the substrate surface by laser irradiation. That is, defects can be effectively repaired by means of a laser.

In the process of manufacturing a phase shift mask from the phase shift mask blank, pattern recognition may sometimes be done utilizing the reflection of light having a wavelength of about 550 nm. Since a contrast between the uncovered substrate area and the phase shifter section is established by a difference in reflectance, the phase shifter section (phase shift film) should desirably have a reflectance of at least 10%. In the construction where the light absorption function film is disposed contiguous to the substrate, however, under the influence of optical interference, the reflectance in proximity to 550 nm is sometimes below the level of 10% required for the defect inspecting system.

In the embodiment of the present invention wherein two layers of light absorption function film are present, and one of the two layers is disposed contiguous to the substrate, it is recommended that the interface of the other layer of light absorption function film on the surface side of the phase shift multilayer film be located at a depth within 68.75 nm (=137.5/2 nm), more desirably within 34.375 nm (=137.5/4 nm), from the surface of the phase shift multilayer film. Then the reflectance in proximity to 550 nm is at or above 10%, even in the construction where the light absorption function film is disposed contiguous to the substrate.

Figure 6:
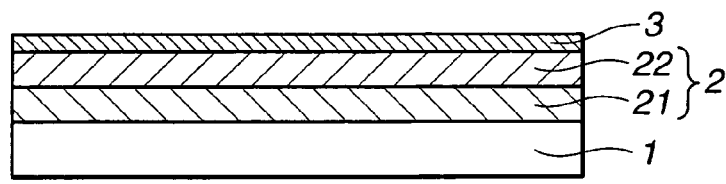
FIG. 6 is a sectional view of a phase shift mask blank having a chromium-based light-shielding film
Figure 7:
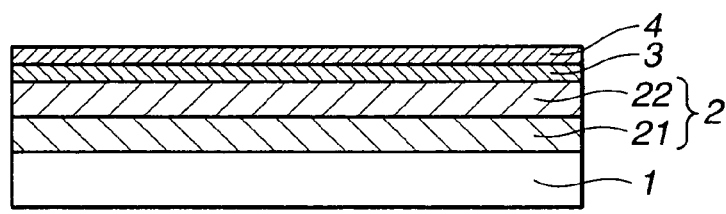
FIG. 7 is a sectional view of a phase shift mask blank having a chromium-based light-shielding film and a chromium-based antireflection film.
Figure 8:
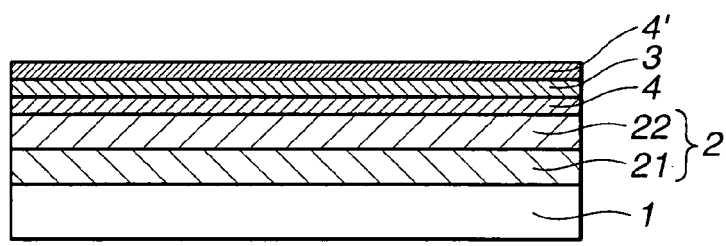
FIG. 8 is a sectional view of a phase shift mask blank having a chromium-based light-shielding film and chromium-based antireflection films.

In preferred embodiments of the invention, a chromium based light-shielding film or a chromium based antireflective film or both are formed on the phase shift multilayer film. In one preferred embodiment, as shown in FIG. 6, the phase shift mask blank further includes a chromium-based light-shielding film 3 on the phase shift multilayer film 2. In a further preferred embodiment, as shown in FIG. 7, the phase shift mask blank further includes a chromium-based antireflection film 4 formed on the chromium-based light-shielding film 3 for reducing reflection from the light-shielding film 3. In a still further preferred embodiment, as shown in FIG. 8, the phase shift mask blank includes a phase shift multilayer film 2, a first chromium-based antireflection film 4, a chromium-based light-shielding film 3, and a second chromium-based antireflection film 4' formed on a substrate 1 in the described order. It is noted in FIGS. 6 to 8 that the phase shift multilayer film 2 consists of a light absorption function film 21 and a phase shift function film 22.

The chromium-based light-shielding film or chromium-based antireflection film is preferably made of chromium oxycarbide (CrOC), chromium oxynitride carbide (CrONC) or a multilayer combination of both.

The chromium-based light-shielding film or chromium-based antireflection film can be formed by reactive sputtering. Specifically, the target is chromium by itself or chromium having added thereto oxygen, nitrogen, carbon or a combination thereof. The sputtering gas is an inert gas such as neon, argon or krypton to which carbon dioxide gas is added as a carbon source.

For example, sputtering gases which may be used to form a CrONC film include a gas mixture composed of at least one each of a carbon-containing gas (e.g., $CH_4$, $CO_2$, CO), a nitrogen-containing gas (e.g., NO, $NO_2$, $N_2$) and an oxygen-containing gas (e.g., $CO_2$, NO, $O_2$), or any such gas mixture in combination with an inert gas such as argon, neon or krypton. Using $CO_2$ gas or CO gas as both the carbon and oxygen sources is especially advantageous for uniformity in the plane of the substrate and for controllability during production. Each of the sputtering gases may be separately fed into the sputtering chamber, or some or all of the gases may first be mixed together then fed into the chamber.

Preferably the CrOC film consists essentially of 20 to 95 at %, especially 30 to 85 at % of Cr, 1 to 30 at %, especially 5 to 20 at % of C, and 1 to 60 at %, especially 5 to 50 at % of O; and the CrONC film consists essentially of 20 to 95 at %, especially 30 to 80 at % of Cr, 1 to 20 at %, especially 2 to 15 at % of C, 1 to 60 at %, especially 5 to 50 at % of O, and 1 to 30 at %, especially 3 to 20 at % of N.

The phase shift mask of the invention is manufactured by patterning the phase shift multilayer film on the phase shift mask blank as described above.

Figure 9:
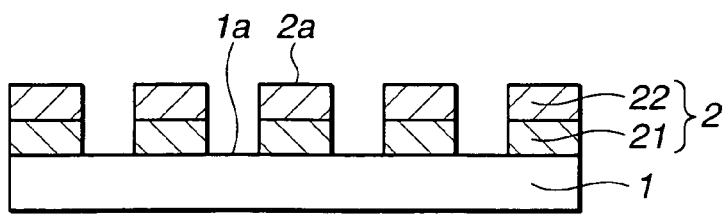
FIG. 9 is a sectional view of a phase shift mask in one embodiment of the invention.
Figure 10A:
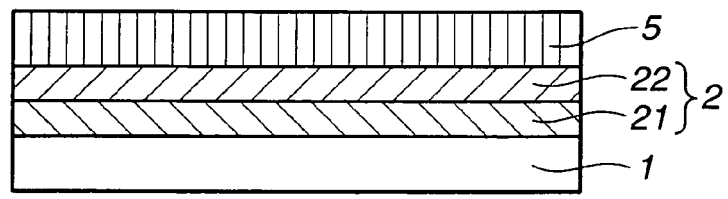
FIG. 10A shows the mask blank on which a resist film has been formed.
Figure 10B:
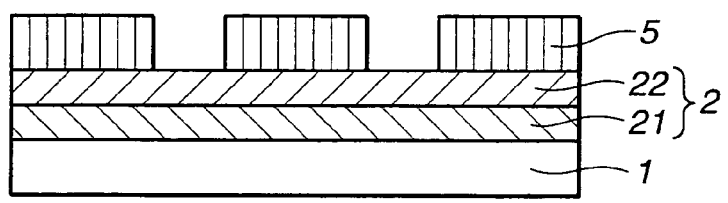
FIG. 10B shows the structure after the resist film has been patterned.
Figure 10C:
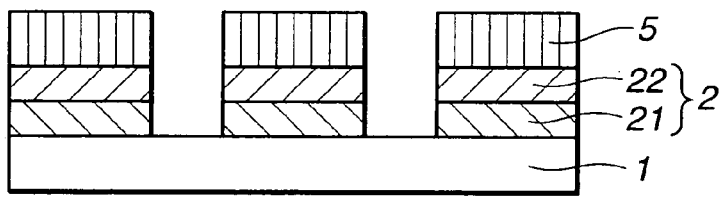
FIG. 10C shows the structure after etching.
Figure 10D:
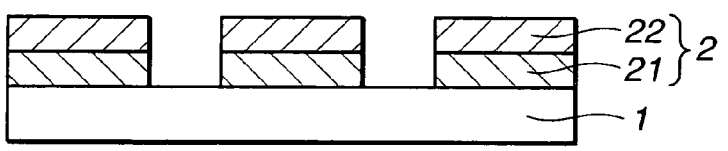
FIG. 10D shows the structure after the resist film has been removed.

More specifically, by patterning the phase shift multilayer film 2 on the phase shift mask blank shown in FIG. 1, a phase shift mask as shown in FIG. 9 is manufactured. The phase shift mask includes patterned phase shifter sections 2a and uncovered substrate areas 1a therebetween.

The phase shift mask of the structure shown in FIG. 9 may be manufactured by a process as shown in FIG. 10. After a phase shift multilayer film 2 is formed on a substrate 1 by the process described above, a resist film 5 is formed on the film 2 (FIG. 10A). The resist film 5 is lithographically patterned (FIG. 10B), after which the phase shift multilayer film 2 is etched (FIG. 10C), and the resist film 5 is subsequently stripped (FIG. 10D). In this process, application of the resist film, patterning (exposure and development), etching, and removal of the resist film may be carried out by known methods. It is appreciated that the phase shift multilayer film 2 can be etched overall with a single etching gas.

Figure 11:
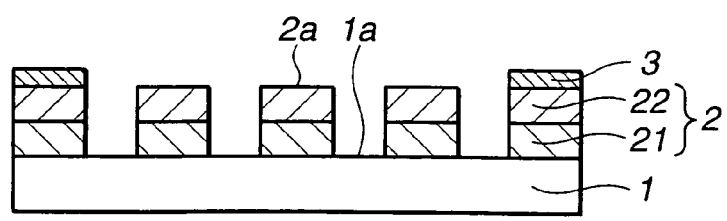
FIG. 11 is a sectional view showing a phase shift mask in another embodiment of the invention.

In cases where a Cr-based film (e.g., chromium-based light-shielding film and/or chromium-based antireflection film) is formed on the phase shift multilayer film, a phase shift mask on which the Cr-based film (chromium-based light-shielding film 3) remains at the peripheral edges of the substrate 1 (see FIG. 11) can be produced by etching away the Cr-based film 3 in the regions that are to be subject to light exposure, thereby leaving the surface of the phase shift multilayer film 2 exposed, then patterning the phase shift multilayer film 2 into sections 2a as described above. Alternatively, a phase shift mask can be produced by applying a resist to the Cr-based film 3 and patterning the resist, then etching the Cr-based film 3 and the phase shift multilayer film 2 for patterning. Only the regions of the Cr-based film 3 that are to be subject to light exposure are then removed by selective etching so as to leave the phase shift pattern exposed at the surface.

The phase shift multilayer film on the phase shift mask blank and the phase shift mask of the invention has minimized dependency of transmittance on wavelength, can be processed with a single dry etching gas, and exhibits a favorable transmittance at both the exposure wavelength and the inspection wavelength. Thus the phase shift mask blank and the phase shift mask of the invention are useful as a high transmittance halftone phase shift mask blank and phase shift mask adapted for ArF excimer laser exposure, and a halftone phase shift mask blank and phase shift mask adapted for $F_2$ laser exposure (though not limited thereto).

The phase shift mask of the invention ensures a high reliability of defect inspection when defect inspection is carried out using light having a wavelength of about 240 to 270 nm, especially light having a wavelength of 260 to 270 nm commonly used in the current defect inspection systems. This is particularly true upon defect inspection of a high transmittance halftone phase shift mask blank and phase shift mask adapted for ArF excimer laser exposure, and a halftone phase shift mask blank and phase shift mask adapted for $F_2$ laser exposure. Defect inspection with a higher reliability is possible when the inspection light used is light having a wavelength shorter than 260 nm, for example, light having a wavelength of about 240 nm.

The phase shift mask of the invention is used to transfer a pattern formed on the phase shift mask to an article. Prior to use, whether the phase shift mask is acceptable or defective can be judged by defect inspection using light having a wavelength of 240 to 270 nm. It is then possible to select (passed) conformable phase shift masks and exclude (rejected) defective phase shift masks with a higher precision than in the prior art. As a result, the process yield is increased, and products become of consistent quality.

The phase shift mask of the invention exhibits a reflectance of about 10% at a wavelength of 450 to 600 nm. This permits the phase shift mask to be adjustably aligned by recognizing the pattern thereon using light having a wavelength of 450 to 600 nm, ensuring subsequent light exposure with high precision.

EXAMPLE

Experiments, Examples and Comparative Examples are given below for illustrating the invention although the invention is not limited thereto.

Experiments 1-4

On a quartz substrate, a thin film of an unsaturated metal compound containing Mo, Zr and Si was formed. The wavelength dependency of its extinction coefficient k was evaluated. The unsaturated metal compound thin film was deposited as follows.

As the sputtering gas, Ar gas and $N_2$ and/or $O_2$ gas were fed at the flow rates shown in Table 1. During the gas feed, a gas pressure of 0.1 Pa was set in the sputtering chamber. By applying a discharge power of 500 W across a sintered $Mo_5ZrSi_{54}$ target and rotating the substrate at 30 rpm, films of MoZrSi-based unsaturated metal compound were deposited. These films were evaluated for wavelength dependency of extinction coefficient k, with the results shown in FIG. 12. Note that the gas flow rate is determined at 0° C. and 1 atm. (1013 hPa).

TABLE 1

| Experiment No. | Gas flow rate (cm³/min) | | |
|---|---|---|---|
| | Ar | $N_2$ | $O_2$ |
| 1 | 20 | 0 | 0 |
| 2 | 20 | 0 | 0.3 |

TABLE 1-continued

| Experiment No. | Gas flow rate (cm³/min) | | |
|---|---|---|---|
| | Ar | $N_2$ | $O_2$ |
| 3 | 20 | 0 | 0.5 |
| 4 | 20 | 2.5 | 0.3 |

Figure 12:
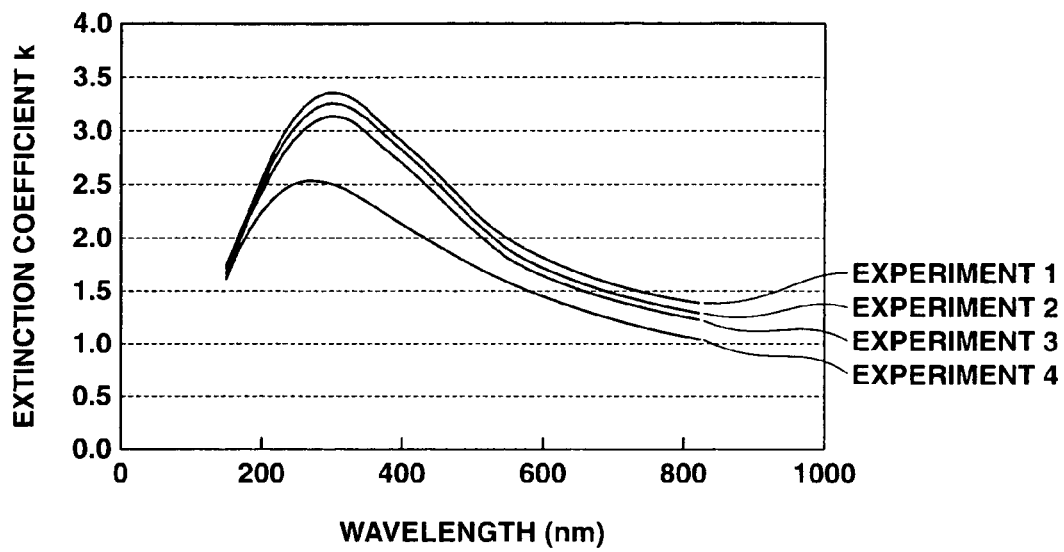
FIG. 12 is a graph showing the wavelength dependency of the extinction coefficient k of an unsaturated metal compound film of MoZrSi system.

As seen from FIG. 12, the unsaturated metal compound films obtained by adding minor amounts of oxygen and/or nitrogen during sputtering deposition have an extinction coefficient k relative to light having a wavelength in the range of 157 to 260 nm that increases from the wavelength 157 nm to 260 nm.

Example 1

A phase shift mask blank having a phase shift multilayer film of three-layer structure deposited on a substrate as shown in FIG. 2 was prepared.

Figure 13:
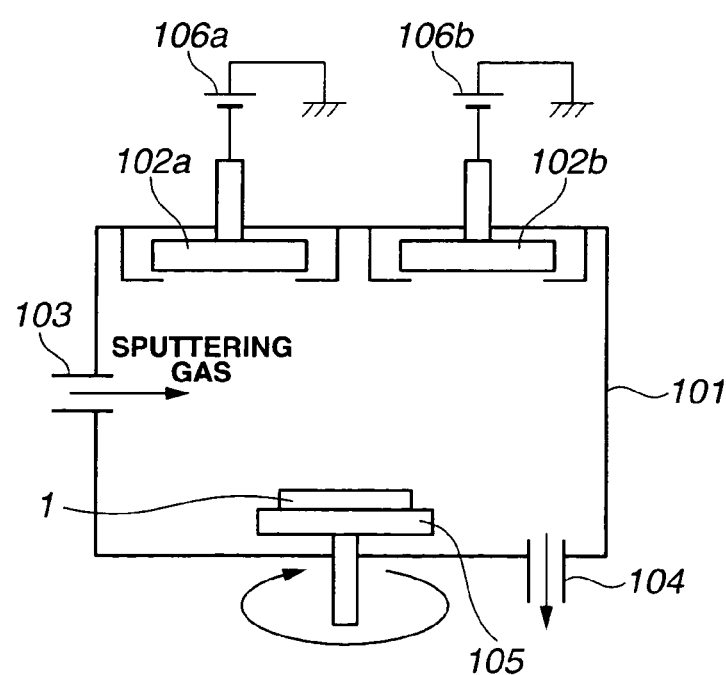
FIG. 13 is a schematic view of the d.c. sputtering system used in Examples.

First, a light absorption function film was deposited on a quartz substrate. As the sputtering gas, Ar gas was fed at a flow rate of 15 cm³/min. During the gas feed, a gas pressure of 0.15 Pa was set in the sputtering chamber. By applying a discharge power of 560 W across a sintered $MoSi_2$ target and a discharge power of 1000 W across a Si single crystal target and rotating the substrate at 30 rpm, a film consisting of molybdenum and silicon (MoSi film) was deposited to a thickness of 2.5 nm, forming a light absorption function film. For the deposition, a d.c. sputtering system including two targets as shown in FIG. 13 was used (the same system was used in subsequent deposition). The system of FIG. 13 includes a chamber 101 in which a substrate 1 is rested on a rotating support 105, and a $MoSi_2$ target 102a and a silicon target 102b are situated and electrically coupled to power supplies 106a and 106b, respectively. The chamber 101 is provided with a sputtering gas inlet 103 and a gas discharge port 104.

Next, a first layer of phase shift function film was deposited. Deposition was similarly performed except that the discharge power was 200 W across the $MoSi_2$ target and 1000 W across the Si target, the sputtering gas was a mixture of 15 cm³/min of Ar, 100 cm³/min of $N_2$ and 1 cm³/min of $O_2$, and the gas pressure was 0.25 Pa. A film of a saturated compound containing molybdenum and silicon (MoSiON film) was deposited to a thickness of 40 nm.

Further, a second layer of phase shift function film was deposited. Deposition was similarly performed except that the discharge power was 200 W across the $MoSi_2$ target and 1000 W across the Si target, the sputtering gas was a mixture of 5 cm³/min of Ar, 50 cm³/min of $N_2$ and 1 cm³/min of $O_2$, and the gas pressure was 0.1 Pa. A film of a saturated compound containing molybdenum and silicon (MoSiON film) was deposited to a thickness of 45 nm.

The phase shift multilayer film was designed so as to provide a phase difference of 180° and a transmittance of 18% at a wavelength of 193 nm (ArF excimer laser).

The phase shift multilayer film of the thus obtained phase shift mask blank was examined by the following tests.

Wavelength Dependency of Transmittance

Figure 14:
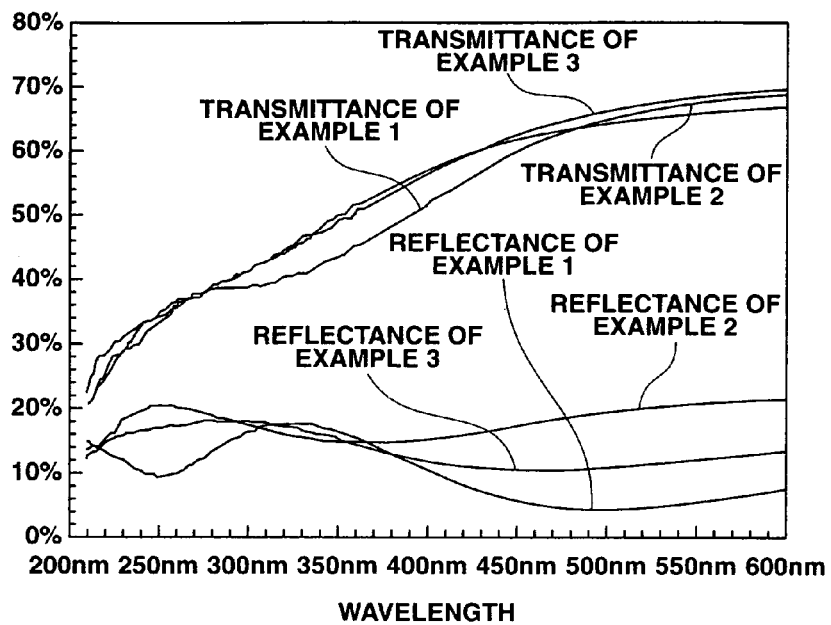
FIG. 14 is a graph showing the wavelength dependency of transmittance and reflectance of phase shift mask blanks of Examples 1 to 3.

Using a spectrophotometer, the transmittance of the phase shift multilayer film was measured when light was incident on the transparent substrate. The results are plotted in the graph of FIG. 14. It is seen from FIG. 14 that the transmittance in proximity to 260 nm was as low as 40%.

Dry Etching

The phase shift multilayer film was subjected to $CF_4$ dry etching, that is, dry etching with a mixture of $CF_4$ and $O_2$ in a ratio 80:1 (SCCM) at a power of 60 W, a pressure of 2 Pa, and a period of 4 min. A cross section of the etched film was observed under a scanning electron microscope. The etched cross-section was of acceptable shape, with no step being found between the light absorption function film and the phase shift function film.

Wavelength Dependency of Reflectance

Using a spectrophotometer, the reflectance of the phase shift multilayer film was measured when light was incident on the film surface. The results are also plotted in the graph of FIG. 14. It is seen from FIG. 14 that the reflectance at a wavelength of longer than 400 nm was below 10%.

Ease of Laser Repair

The phase shift multilayer film was irradiated with laser light to see whether or not only the desired regions of the film could be removed. It was confirmed for the phase shift multilayer film that only the desired regions thereof could be removed completely with the transparent substrate being exposed.

It is seen from these results that the phase shift multilayer film is compliant to defect inspection because it has a transmittance of about 40% in proximity to 260 nm essential for defect inspection, despite a reflectance of less than 10% relative to light having a wavelength of at least 400 nm. The phase shift multilayer film can be patterned by a dry etching process with $CF_4$ alone and effectively repaired by means of a laser. Therefore, it is an improved phase shift film conforming to the mask manufacturing process.

Example 2

A phase shift mask blank having a phase shift multilayer film of four-layer structure deposited on a substrate as shown in FIG. 4 was prepared.

The phase shift multilayer film was obtained by first depositing a first layer of light absorption function film on a quartz substrate under the same conditions as used for the light absorption function film in Example 1 except that the thickness was 1.25 nm, then depositing a first layer of phase shift function film under the same conditions as used in Example 1, depositing a second layer of light absorption function film under the same conditions as used for the first layer, and finally depositing a second layer of phase shift function film under the same conditions as used in Example 1.

The phase shift multilayer film was designed so as to provide a phase difference of 180° and a transmittance of 18% at a wavelength of 193 nm (ArF excimer laser).

The phase shift multilayer film of the thus obtained phase shift mask blank was examined by the following tests.

Wavelength Dependency of Transmittance

The transmittance of the phase shift multilayer film was measured by the same procedure as in Example 1. The results are plotted in the graph of FIG. 14. It is seen from FIG. 14 that the transmittance in proximity to 260 nm was as low as 40%.

Dry Etching

The phase shift multilayer film was dry etched by the same procedure as in Example 1. The etched cross-section was of acceptable shape, with no step being found between the light absorption function film and the phase shift function film.

Wavelength Dependency of Reflectance

The reflectance of the phase shift multilayer film was measured by the same procedure as in Example 1. The results are also plotted in the graph of FIG. 14. It is seen from FIG. 14 that the reflectance at a wavelength of longer than 400 nm was above 10%. The multilayer film was confirmed to be a phase shift film that can be effectively inspected by an inspection system designed to acquire a contrast from reflectance.

Ease of Laser Repair

The phase shift multilayer film was irradiated with laser light to see whether or not only the desired regions of the film could be removed. It was confirmed for the phase shift multilayer film that only the desired regions thereof could be removed completely with the transparent substrate being exposed.

It is seen from these results that the phase shift multilayer film is fully compliant to defect inspection because it has a reflectance of more than 10% relative to light in a broad wavelength range of 193 to 600 nm and a transmittance of about 40% in proximity to 260 nm essential for defect inspection. The phase shift multilayer film can be patterned by a dry etching process with $CF_4$ alone and effectively repaired by means of a laser. Therefore, it is an improved phase shift film conforming to the mask manufacturing process.

Example 3

A phase shift mask blank having a phase shift multilayer film of three-layer structure deposited on a substrate as shown in FIG. 3 was prepared.

The phase shift multilayer film was obtained by sequentially depositing a first layer of phase shift function film, a layer of light absorption function film, and a second layer of phase shift function film on a substrate in the described order. These layers were the same as the corresponding layers in Example 1 and deposited under the same conditions as in Example 1.

The phase shift multilayer film was designed so as to provide a phase difference of 180° and a transmittance of 18% at a wavelength of 193 nm (ArF excimer laser).

The phase shift multilayer film of the thus obtained phase shift mask blank was examined by the following tests.

Wavelength Dependency of Transmittance

The transmittance of the phase shift multilayer film was measured by the same procedure as in Example 1. The results are plotted in the graph of FIG. 14. It is seen from FIG. 14 that the transmittance in proximity to 260 nm was as low as 40%.

Dry Etching

The phase shift multilayer film was dry etched by the same procedure as in Example 1. The etched cross-section was of acceptable shape, with no step being found between the light absorption function film and the phase shift function film.

Wavelength Dependency of Reflectance

The reflectance of the phase shift multilayer film was measured by the same procedure as in Example 1. The results are also plotted in the graph of FIG. 14. It is seen from FIG. 14 that the reflectance at a wavelength of longer than 400 nm was above 10%. The multilayer film was confirmed to be a phase shift film that can be effectively inspected by an inspection system designed to acquire a contrast from reflectance.

Ease of Laser Repair

The phase shift multilayer film was irradiated with laser light to see whether or not only the desired regions of the film could be removed. It was confirmed for the phase shift multilayer film that in most cases, only the desired regions thereof could be removed completely with the transparent substrate being exposed. In a few cases, part of the phase shift film was left on the transparent substrate.

It is seen from these results that the phase shift multilayer film is fully compliant to defect inspection because it has a reflectance of more than 10% relative to light in a broad wavelength range of 193 to 600 nm and a transmittance of about 40% in proximity to 260 nm essential for defect inspection. The phase shift multilayer film can be patterned by a dry etching process with $CF_4$ alone and effectively repaired by means of a laser. Therefore, it is an improved phase shift film conforming to the mask manufacturing process.

Example 4

A phase shift mask blank having a phase shift multilayer film of three-layer structure deposited on a substrate as shown in FIG. 2 was prepared.

The phase shift multilayer film was obtained by depositing layers as in Example 1 except that the light absorption function film was deposited under the following conditions. As the sputtering gas, a gas mixture of 15 $cm^3$/min of Ar, 5 $cm^3$/min of $N_2$ and 1 $cm^3$/min of $O_2$ was fed. During the gas feed, a gas pressure of 0.15 Pa was set in the sputtering chamber. By applying a discharge power of 560 W across a sintered $MoSi_2$ target and a discharge power of 1000 W across a Si single crystal target and rotating the substrate at 30 rpm, a film of an unsaturated compound comprising molybdenum and silicon as primary elements (MoSi-rich film or MoSiON film) was deposited to a thickness of 6 nm, forming a light absorption function film.

The phase shift multilayer film was designed so as to provide a phase difference of 180° and a transmittance of 18% at a wavelength of 193 nm (ArF excimer laser).

The phase shift multilayer film of the thus obtained phase shift mask blank was examined by the following tests.

Wavelength Dependency of Transmittance

The transmittance of the phase shift multilayer film was measured by the same procedure as in Example 1. The transmittance in proximity to 260 nm was as low as about 42%.

Dry Etching

The phase shift multilayer film was dry etched by the same procedure as in Example 1. The etched cross-section was of acceptable shape, with no step being found between the light absorption function film and the phase shift function film.

Wavelength Dependency of Reflectance

The reflectance of the phase shift multilayer film was measured by the same procedure as in Example 1. The reflectance at a wavelength of longer than 450 nm was below 10%.

Ease of Laser Repair

The phase shift multilayer film was irradiated with laser light to see whether or not only the desired regions of the film could be removed. It was confirmed for the phase shift multilayer film that only the desired regions thereof could be removed completely with the transparent substrate being exposed.

It is seen from these results that the phase shift multilayer film is compliant to defect inspection because it has a transmittance of about 42% in proximity to 260 nm essential for defect inspection, despite a reflectance of less than 10% relative to light having a wavelength of at least 450 nm. The phase shift multilayer film can be patterned by a dry etching process with $CF_4$ alone and effectively repaired by means of a laser. Therefore, it is an improved phase shift film conforming to the mask manufacturing process.

Example 5

A phase shift mask blank having a phase shift multilayer film of three-layer structure deposited on a substrate as shown in FIG. 2 was prepared.

The phase shift multilayer film was obtained by depositing layers as in Example 1 except that the light absorption function film was deposited under the following conditions. As the sputtering gas, a gas mixture of 15 $cm^3$/min of Ar, 8 $cm^3$/min of $N_2$ and 1 $cm^3$/min of $O_2$ was fed. During the gas feed, a gas pressure of 0.15 Pa was set in the sputtering chamber. By applying a discharge power of 560 W across a sintered $MoSi_2$ target and a discharge power of 1000 W across a Si single crystal target and rotating the substrate at 30 rpm, a film of an unsaturated compound comprising molybdenum and silicon as primary elements (MoSi-rich film or MoSiON film) was deposited to a thickness of 15 nm, forming a light absorption function film.

The phase shift multilayer film was designed so as to provide a phase difference of 180° and a transmittance of 18% at a wavelength of 193 nm (ArF excimer laser).

The phase shift multilayer film of the thus obtained phase shift mask blank was examined by the following tests.

Wavelength Dependency of Transmittance

The transmittance of the phase shift multilayer film was measured by the same procedure as in Example 1. The transmittance in proximity to 260 nm was as low as about 44%.

Dry Etching

The phase shift multilayer film was dry etched by the same procedure as in Example 1. The etched cross-section was at a practically acceptable level, with modest steps being found between the light absorption function film and the phase shift function film.

Wavelength Dependency of Reflectance

The reflectance of the phase shift multilayer film was measured by the same procedure as in Example 1. The reflectance at a wavelength of longer than 470 nm was below 10%.

Ease of Laser Repair

The phase shift multilayer film was irradiated with laser light to see whether or not only the desired regions of the film could be removed. It was confirmed for the phase shift multilayer film that only the desired regions thereof could be removed completely with the transparent substrate being exposed.

It is seen from these results that the phase shift multilayer film is compliant to defect inspection because it has a transmittance of about 44% in proximity to 260 nm essential for defect inspection, despite a reflectance of less than 10% relative to light having a wavelength of at least 470 nm. The phase shift multilayer film can be patterned by a dry etching process with $CF_4$ alone and effectively repaired by means of a laser. Therefore, it is an improved phase shift film conforming to the mask manufacturing process.

Comparative Example 1

A phase shift mask blank having a single layer of phase shift film deposited on a substrate was prepared.

The phase shift film was deposited by feeding a gas mixture of 5 cm³/min of Ar, 50 cm³/min of $N_2$ and 2 cm³/min of $O_2$ as the sputtering gas. During the gas feed, a gas pressure of 0.1 Pa was set in the sputtering chamber. By applying a discharge power of 200 W across a sintered $MoSi_2$ target and a discharge power of 1000 W across a Si single crystal target and rotating the substrate at 30 rpm, a film of a saturated compound comprising molybdenum and silicon (MOSiON film) was deposited to a thickness of 70 nm.

The single layer phase shift film was designed so as to provide a phase difference of 180° and a transmittance of 18% at a wavelength of 193 nm (ArF excimer laser).

The phase shift film of the thus obtained phase shift mask blank was examined by the following tests.

Wavelength Dependency of Transmittance

Figure 15:
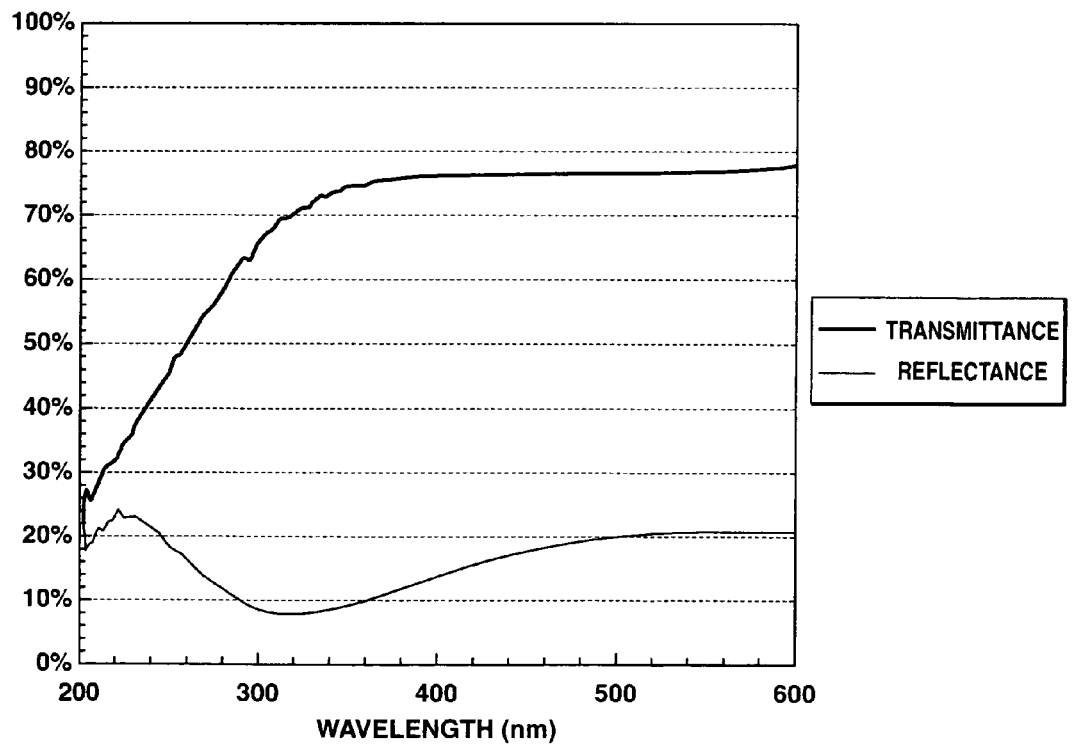
FIG. 15 is a graph showing the wavelength dependency of transmittance and reflectance of a phase shift mask blank of Comparative Example 1.
Figure 17:
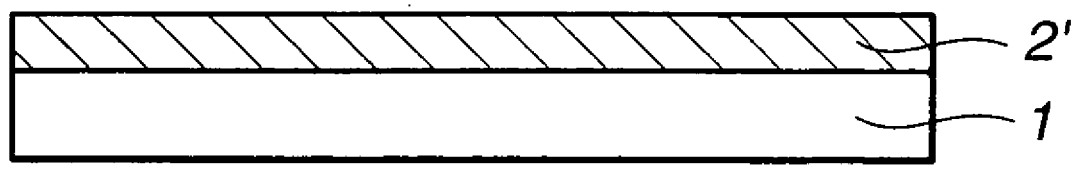
FIG. 17 is a sectional view of a prior art phase shift mask blank.
Figure 18:
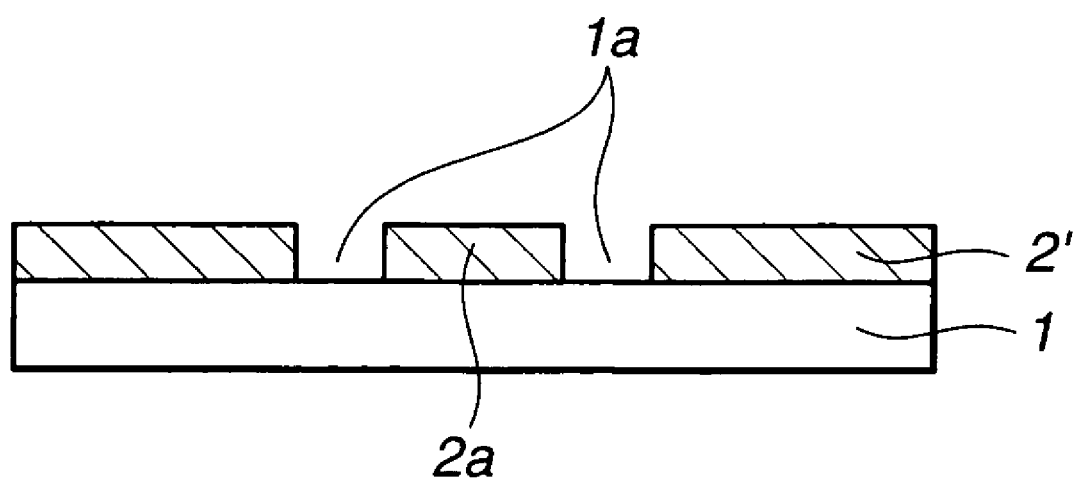
FIG. 18 is a sectional view of a prior art phase shift mask made from the blank of FIG. 17.

The transmittance of the phase shift film was measured by the same procedure as in Example 1. The results are plotted in the graph of FIG. 15. The transmittance in proximity to 260 nm was beyond 50%, indicating difficult inspection by a defect inspection system.

Dry Etching

The phase shift film was dry etched by the same procedure as in Example 1. The etched cross-section was of acceptable shape because the phase shift film was a single layer.

Wavelength Dependency of Reflectance

The reflectance of the phase shift film was measured by the same procedure as in Example 1. The results are also plotted in the graph of FIG. 15. The reflectance in the wavelength range of 290 to 360 nm was below 10%.

Ease of Laser Repair

The phase shift film was irradiated with laser light to see whether or not only the desired regions of the film could be removed. It was confirmed for the phase shift film that only the desired regions thereof could be removed completely with the transparent substrate being exposed.

It is seen from these results that the phase shift film is substantially impossible for a defect inspecting system to perform inspection because it has a reflectance of less than 10% relative to light having a wavelength of at least 400 nm and a transmittance of more than 50% in proximity to 260 nm essential for defect inspection. The defect inspection step is one of key steps in the mask manufacture. Defect inspecting systems capable of measurement at a wavelength of shorter than 260 nm are very expensive, and no practical system is now available in a substantial sense. Under the current situation, a transmittance of more than 50% in proximity to 260 nm is fatal to the defect inspection. Thus the phase shift film of this construction is difficult to apply to a high transmittance halftone phase shift mask adapted for ArF excimer laser exposure, and a halftone phase shift mask adapted for $F_2$ laser exposure.

Comparative Example 2

A phase shift mask blank having a phase shift multilayer film of three-layer structure deposited on a substrate as shown in FIG. 2 was prepared.

The phase shift multilayer film was deposited as in Example 1 except that the light absorption function film had a thickness of 18 nm.

The phase shift multilayer film of the thus obtained phase shift mask blank was examined by the following tests. Only the tests for dry etching and ease of laser repair were employed herein because the transmittance differed from Examples.

Dry Etching

The phase shift multilayer film was dry etched by the same procedure as in Example 1. A cross section of the etched film was observed under SEM. Apparent steps were found between the light absorption function film and the first layer of phase shift function film as a result of a difference in etching rate. The light absorption function film had a low etching rate so that its etching took a longer time. This expresses concern about a possibility of pattern variation in the mask plane.

Ease of Laser Repair

The phase shift multilayer film was irradiated with laser light to see whether or not only the desired regions of the film could be removed. It was confirmed for the phase shift multilayer film that only the desired regions thereof could be removed completely with the transparent substrate being exposed.

The phase shift multilayer film was difficult to pattern by etching with a single gas.

Japanese Patent Application No. 2003-364227 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A phase shift mask blank comprising a phase shift multilayer film on a substrate,
    said phase shift multilayer film consisting of
    at least one layer of light absorption function film formed of a metal, a metal and silicon, or an unsaturated metal compound in the form of an oxide, nitride, carbide, oxynitride, oxynitride carbide or nitride carbide comprising a metal or a metal and silicon as primary elements, and
    at least one layer of phase shift function film formed of an oxide, nitride, carbide, oxynitride, oxynitride carbide or nitride carbide comprising a metal or a metal and silicon,
    said light absorption function film having an extinction coefficient k relative to light of wavelength 157 to 260 nm which increases from the wavelength 157 nm toward 260 nm, and said light absorption function film having a thickness of up to 15 nm.

2. The phase shift mask blank of claim 1, wherein said light absorption function film has an extinction coefficient k of at least 0.5 in the wavelength range of 157 to 260 nm.

3. The phase shift mask blank of claim 1, wherein one layer of said light absorption function film is present and disposed contiguous to the substrate.

4. The phase shift mask blank of claim 1, wherein two layers of said light absorption function film are present, and one of the two layers is disposed contiguous to the substrate.

5. The phase shift mask blank of claim 4, wherein the interface of the other layer of light absorption function film on the surface side of said phase shift multilayer film is located at a depth within 68.75 nm from the surface of said phase shift multilayer film.

6. The phase shift mask blank of claim 1, further comprising at least one of a chromium based light-shielding film and a chromium based antireflective film on said phase shift multilayer film.

7. A phase shift mask obtained by patterning the phase shift multilayer film in the phase shift mask blank of claim 1.

8. A method of transferring a pattern formed on a phase shift mask to an article, wherein an acceptable phase shift mask is used which is selected by inspecting for defects phase shift masks as set forth in claim 7 using light having a wavelength of 240 to 270 nm.

9. A method of transferring a pattern formed on a phase shift mask to an article, wherein a phase shift mask as set forth in claim 7 is used and the alignment of the mask is adjusted using light having a wavelength of 450 to 600 nm.

* * * * *